(12) United States Patent
Liu

(10) Patent No.: US 7,714,761 B2
(45) Date of Patent: May 11, 2010

(54) VOLTAGE ERROR CORRECTION SYSTEM

(75) Inventor: Chih-Jung Liu, Taipei Hsien (TW)

(73) Assignee: Foxnum Technology Co., Ltd., Tucheng, Taipei County (TW)

( * ) Notice: Subject to any disclaimer, the term of this patent is extended or adjusted under 35 U.S.C. 154(b) by 30 days.

(21) Appl. No.: 12/250,492

(22) Filed: Oct. 13, 2008

(65) Prior Publication Data
US 2010/0045504 A1 Feb. 25, 2010

(30) Foreign Application Priority Data
Aug. 20, 2008 (CN) ......................... 2008 1 0304064

(51) Int. Cl.
*H03M 1/36* (2006.01)
(52) U.S. Cl. ...................... 341/159; 323/280
(58) Field of Classification Search ......... 341/140–165; 323/280, 281, 371
See application file for complete search history.

(56) References Cited

U.S. PATENT DOCUMENTS

| | | | |
|---|---|---|---|
| 6,177,899 B1 * | 1/2001 | Hsu | 341/156 |
| 6,380,881 B2 * | 4/2002 | Harada et al. | 341/165 |
| 7,315,160 B2 * | 1/2008 | Fosler | 323/285 |
| 7,595,744 B2 * | 9/2009 | Agarwal et al. | 341/156 |

\* cited by examiner

*Primary Examiner*—Lam T Mai
(74) *Attorney, Agent, or Firm*—Zhigang Ma

(57) ABSTRACT

A voltage error correction system includes a voltage converter, a first and a second analog to digital converters, a subtracter, an adder, and a digital voltage generator. The voltage converter adjusts an input voltage proportionally, adds the adjusted input voltage to a reference voltage to obtain a positive voltage, and outputs the positive voltage. The first analog to digital converter converts the positive voltage into a first digital voltage, the second analog to digital converter converts the reference voltage into a second digital voltage, the subtracter subtracts the second digital voltage from the first digital voltage and outputs a difference voltage, and the adder outputs a corrected voltage by adding the difference voltage of the subtracter to a compensation voltage.

9 Claims, 2 Drawing Sheets

VOLTAGE ERROR CORRECTION SYSTEM

BACKGROUND

1. Field of the Invention

The present invention relates to a voltage error correction system, and particularly to a system for correcting errors generated by a voltage generator.

2. Description of Related Art

A power supply system is usually used for receiving an alternating current (AC) voltage, and converting the AC voltage into a positive voltage by a positive direct current (DC) voltage generated by a voltage generator which has errors. Then, the positive voltage is converted into a digital voltage provided to a digital electronic device.

Referring to FIG. 2, one such power supply system, such as a motor driven power supply system, includes a voltage generator 10, a voltage converter 20, and an analog to digital converter 30. The voltage converter 20 receives an AC voltage Vin provided by a power supply (not shown), and a positive DC reference voltage Vref provided by the voltage generator 10. The voltage converter 20 is configured for adjusting the AC voltage Vin proportionally, adding the adjusted AC voltage Vin to the reference voltage Vref to obtain a positive voltage, and outputting the positive voltage to the analog to digital converter 30. The analog to digital converter 30 receives the positive output voltage from the voltage converter 20, and converts the positive voltage into a digital output voltage Vout.

In this power supply system, if an error exists in the reference voltage Vref provided by the voltage generator 10, the system takes no error correction measures, thereby the error still exists in the digital voltage Vout. For example, if the range of the AC voltage Vin is from −2.0 volts to +2.0 volts, an adjustment ratio of the voltage converter 20 is predetermined to be 0.75. When the voltage generator 10 outputs an 1.6 volt reference voltage Vref (which has an 0.1 volt absolute error), the voltage converter 20 adjusts the AC voltage Vin proportionally and adds the reference voltage Vref to the adjusted AC voltage Vin, and the range of the output voltage from the voltage converter 20 is from −2.0*0.75+1.6=0.1 volts to +2.0*0.75+1.6=3.1 volts. The range of the output voltage from the analog to digital converter 30 is 0.1-3.1 volts. That is to say, the 0.1 volt absolute error still exists in this power supply system.

Therefore, it is desired to provide a voltage error correction system to overcome the above described shortcomings.

DETAILED DESCRIPTION

Figure 1:
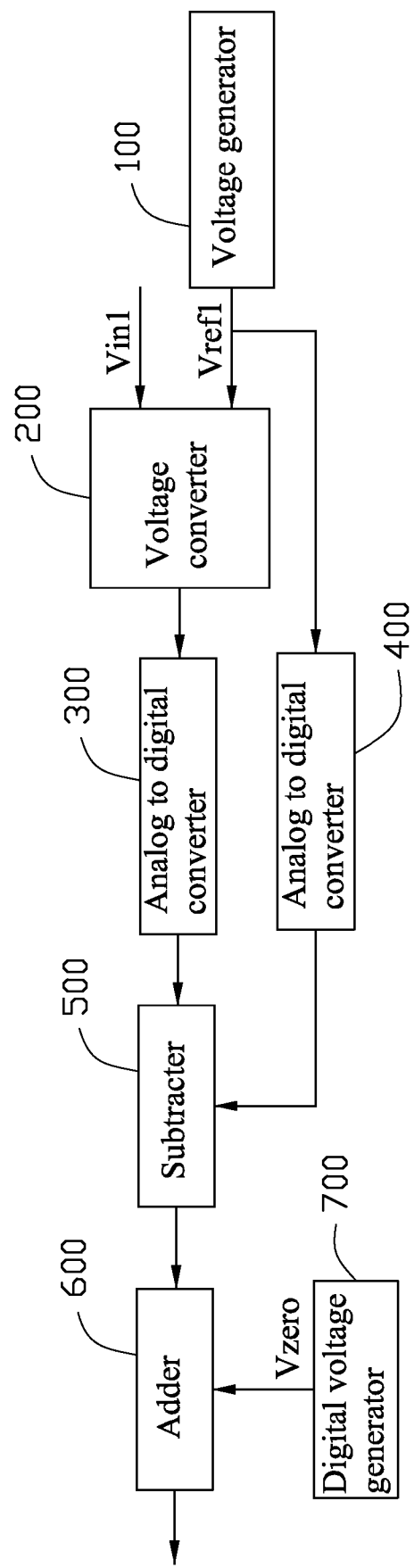
FIG. 1 is a block diagram of an exemplary embodiment of a voltage error correction system of the present disclosure.
Figure 2:
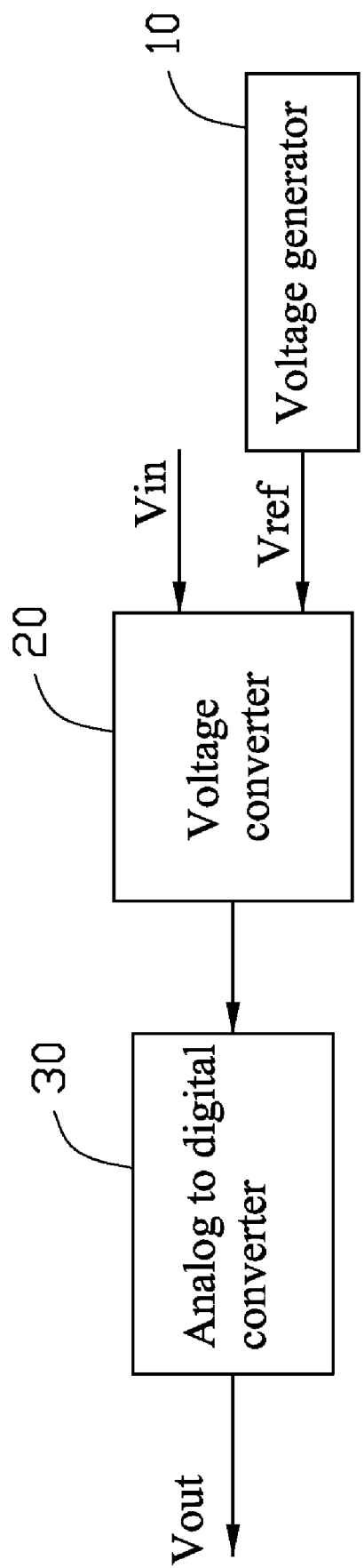
FIG. 2 is a block diagram of a conventional power supply system.

Referring to FIG. 1, an exemplary embodiment of a embodiment of a voltage error correction system includes a voltage generator 100, a voltage converter 200, two analog to digital converters 300 and 400, a subtracter 500, an adder 600, and a digital voltage generator 700.

The voltage converter 200 receives an AC voltage Vin1 provided by a power supply (not shown), and a positive DC reference voltage Vref1 provided by the voltage generator 100. The voltage converter 200 is configured for adjusting the AC voltage Vin1 proportionally, adding the adjusted AC voltage Vin1 to the reference voltage Vref1 to obtain a positive voltage, and outputting the positive voltage to the analog to digital converter 300.

The analog to digital converter 300 receives the positive output voltage from the voltage converter 200 and converts the positive voltage into a first digital voltage provided to the subtracter 500. The analog to digital converter 400 receives the reference voltage Vref1 and converts the reference voltage Vref1 into a second digital voltage provided to the subtracter 500.

The subtracter 500 subtracts the second digital voltage from the first digital voltage to eliminate the reference voltage Vref1 and outputs a difference voltage, wherein the difference voltage is a difference of voltage value between the first digital voltage and the second digital voltage. The adder 600 receives a compensation voltage Vzero provided by the digital voltage generator 700, such as a microcontroller, and obtains a corrected voltage by adding the compensation voltage Vzero to the difference voltage of the subtracter 500. Because the compensation voltage Vzero is a digital voltage which has no error, the reference voltage Vref1 is eliminated by the subtracter 500, and no error exists in the corrected output voltage from the adder 600.

In one exemplary embodiment, if the range of the AC voltage Vin1 is from −2.0 volts to +2.0 volts, an adjustment ratio of the voltage converter 200 is predetermined to be 0.75. When the voltage generator 100 outputs the reference voltage Vref1 which has no error, the reference voltage Vref1 will be 2.00.75=1.5 volts. The voltage converter 200 adjusts the AC voltage Vin1 proportionally and adds the reference voltage Vref1 to the adjusted AC voltage Vin1, and the range of the output voltage from the voltage converter 200 is from −2.0*0.75+1.5=0 volts to +2.0*0.75+1.5=3 volts. The range of the output voltage from the analog to digital converter 300 is 0-3 volts. The output voltage from the analog to digital converter 400 is 1.5 volts. The subtracter 500 subtracts the output voltage from the analog to digital converter 400 from the output voltage from the analog to digital converter 300, and outputs the voltage range to be from −1.5 volts to +1.5 volts. The adder 600 adds the compensation voltage Vzero to the output voltage of the subtracter 500, and outputs the voltage ranging between 0-3.0 volts. If the voltage generator 100 outputs the reference voltage Vref1 of 1.6 volts which has an error, the voltage converter 200 adjusts the AC voltage Vin1 proportionally and adds the reference voltage Vref1 to the adjusted AC voltage Vin1, and the range of the output voltage from the voltage converter 200 is from −2.0*0.75+1.6=0.1 volts to +2.0*0.75+1.6=3.1 volts. The range of the output voltage from the analog to digital converter 300 is 0.1-3.1 volts. The output voltage from the analog to digital 400 is 1.5 volts. The subtracter 500 subtracts the output voltage from the analog to digital converter 400 from the output voltage from the analog to digital converter 300, and outputs the voltage range from −1.5 volts to +1.5 volts. The adder 600 adds the compensation voltage Vzero to the output voltage of the subtracter 500, and outputs the voltage range to be 0-3.0 volts, that is, no error exists in the output voltage from the voltage error correction system.

It is to be understood, however, that even though numerous characteristics and advantages of the embodiments have been set forth in the foregoing description, together with details of the structure and function of the embodiments, the disclosure is illustrative only, and changes may be made in detail, especially in matters of shape, size, and arrangement of parts within the principles of the embodiments to the full extent indicated by the broad general meaning of the terms in which the appended claims are expressed.

What is claimed is:

1. A voltage error correction system, comprising:
a voltage converter configured to adjust an input voltage proportionally, add the adjusted input voltage to a reference voltage to obtain a positive voltage, and output the positive voltage;
a first analog to digital converter configured to convert the positive voltage into a first digital voltage;
a second analog to digital converter configured to convert the reference voltage into a second digital voltage;
a subtracter configured to subtract the second digital voltage from the first digital voltage to eliminate the reference voltage, output a difference voltage, wherein the difference voltage is a difference of voltage value between the first digital voltage and the second digital voltage;
a digital voltage generator configured to output a compensation voltage; and
an adder configured to output a corrected voltage by adding the difference voltage of the subtracter to the compensation voltage.

2. The voltage error correction system as claimed in claim 1, wherein the reference voltage is a direct current (DC) voltage provided by a voltage generator.

3. The voltage error correction system as claimed in claim 1, wherein the input voltage is an alternating current (AC) voltage.

4. The voltage error correction system as claimed in claim 1, wherein the digital voltage generator is a microcontroller.

5. A voltage error correction method, comprising:
adjusting an input voltage proportionally, adding the adjusted input voltage to a reference voltage to obtain a positive voltage, and outputting the positive voltage;
converting the positive voltage into a first digital voltage;
converting a reference voltage into a second digital voltage;
subtracting the second digital voltage from the first digital voltage to eliminate the reference voltage and outputting a difference voltage by a subtracter, wherein the difference voltage is a difference of voltage value between the first digital voltage and the second digital voltage;
outputting a corrected voltage by adding the difference voltage of the subtracter to a compensation voltage.

6. The voltage error correction method as claimed in claim 5, wherein the reference voltage is a direct current (DC) voltage provided by a voltage generator.

7. The voltage error correction method as claimed in claim 5, wherein the input voltage is an alternating current (AC) voltage.

8. The voltage error correction method as claimed in claim 5, wherein the digital voltage generator is a microcontroller.

9. The voltage error correction method as claimed in claim 5, wherein the compensation voltage is output from a digital voltage generator.

* * * * *